(12) United States Patent
Risbo et al.

(10) Patent No.: US 8,774,419 B2
(45) Date of Patent: Jul. 8, 2014

(54) THERMAL CONTROL OF VOICE COILS IN LOUDSPEAKERS

(75) Inventors: Lars Risbo, Hvalsoe (DK); Milind Anil Borkar, Dallas, TX (US); Theis Buchwald Christiansen, Kobenhavn N (DK)

(73) Assignee: Texas Instruments Incorporated, Dallas, TX (US)

( * ) Notice: Subject to any disclaimer, the term of this patent is extended or adjusted under 35 U.S.C. 154(b) by 352 days.

(21) Appl. No.: 13/247,538

(22) Filed: Sep. 28, 2011

(65) Prior Publication Data

US 2013/0077794 A1    Mar. 28, 2013

(51) Int. Cl.
*H03G 11/00*    (2006.01)
*H04R 3/00*    (2006.01)

(52) U.S. Cl.
CPC .......... *H03G 11/008* (2013.01); *H04R 2499/15* (2013.01); *H04R 3/007* (2013.01)
USPC ............. 381/55; 381/94.9; 381/94.8; 381/28; 381/121

(58) Field of Classification Search
CPC ........ H04R 3/007; H04R 3/00; H04R 29/001; H04R 29/003; H04R 29/004; H04R 3/002; H03F 1/52; H03F 2200/331; H03F 1/30; H03F 2200/03; H03G 11/00; H03G 11/008; H03G 11/02; H03G 11/04; H04S 7/301; H04S 3/00
USPC ............ 381/55, 58, 59, 164, 94.9, 94.8, 94.1, 381/28, 61, 119, 120, 121, 103, 102, 101, 381/100, 99, 93, 83, 71.14, 71.12, 71.11, 381/71.1, 317, 318, 320

See application file for complete search history.

(56) References Cited

U.S. PATENT DOCUMENTS

| 6,940,981 | B2 | 9/2005 | Neunaber |
| 2004/0178852 | A1* | 9/2004 | Neunaber ..................... 330/284 |
| 2008/0175397 | A1* | 7/2008 | Holman ......................... 381/55 |
| 2009/0257599 | A1 | 10/2009 | Sand Jensen et al. |

FOREIGN PATENT DOCUMENTS

JP        55125795 A  *  9/1980

OTHER PUBLICATIONS

Peter et al, Complete Thermal Protection of an Active Loudspeaker, AES, presented at 108th Convention on Paris, France, Feb. 22, 2000, pp. 1-21.*
Chiu, Parish and Anderson, "A Perceptually Transparent Audio Power Reduction Algorithm for Loudspeaker Management", ICASSP 2011, Atlanta, Georgia.

* cited by examiner

*Primary Examiner* — Leshui Zhang
(74) *Attorney, Agent, or Firm* — John R. Pessetto; Frederick J. Telecky, Jr.

(57) ABSTRACT

In an embodiment of the invention, the voice coil of an electro dynamic transducer is protected against thermal overload by estimating the temperature of a magnet in the electro dynamic transducer. When a power limit based on the temperature of the magnet and on a predetermined voice coil temperature limit is reached by an audio signal, the power applied to the voice coil is reduced.

4 Claims, 4 Drawing Sheets

THERMAL CONTROL OF VOICE COILS IN LOUDSPEAKERS

CROSS-REFERENCED TO RELATED APPLICATIONS

This application is related to Ser. No. 13/247,569 entitled "Thermal Protection for Loudspeakers", and to Ser. No. 13/247,554 entitled "Over-excursion Protection for Loudspeakers", filed on even date herewith and are hereby incorporated by reference for all that is disclosed therein.

BACKGROUND

Loudspeakers used in compact and portable devices require significant design compromises that may lead to sub-optimal sound quality and loudness. A loudspeaker used in a compact device (e.g. a cellular phone, an electronic tablet, a laptop computer, a PDA (personal digital assistant), a media player etc.) is usually small. As a result, the sensitivity of the loudspeaker can be low and the diaphragm on the loudspeaker can have a limited range of motion. Often loudspeakers are overdriven in order to obtain the loudness needed to hear the audio signal coming from it.

Overdriving a loudspeaker can cause a magnet and a voice coil in the loudspeaker to overheat because of the additional current needed to overdrive the speaker. Overheating the magnet in a loudspeaker can cause permanent damage to a loudspeaker. For example, overheating can change the shape of the diaphragm of the loudspeaker. A loudspeaker where the diaphragm has changed shape from its original form distorts sound coming from the loudspeaker.

In addition to changing the shape of the diaphragm, overheating a magnet and a voice coil in a loudspeaker can cause the glue holding the voice coil to the driver to melt. When the glue melts it can cause the voice coil to separate from the driver rending the loudspeaker inoperable. Overheating the magnet and the voice coil can also cause the solder connecting an amplifier to the voice coil to melt, disconnecting the loudspeaker from the amplifier.

Loudspeakers used in compact devices are relatively cheap. However, damage to a loudspeaker in a compact device may cause a return of the entire device. In order to reduce the damage done to loudspeakers and improve the loudness and quality of the loudspeakers, the power applied to a loudspeaker needs to be controlled to reduce overheating of the voice coil in a loudspeaker.

DETAILED DESCRIPTION

The drawings and description, in general, disclose a method for protecting an electro dynamic transducer (loudspeaker) against thermal overload of the voice coil. As part of the method, an estimate of the temperature of the voice coil is obtained. When a power limit is reached by an audio signal, the power applied to the voice coil is reduced. The power limit is approximately determined by the temperature of the magnet and the maximum allowable temperature of the voice coil.

Figure 1:
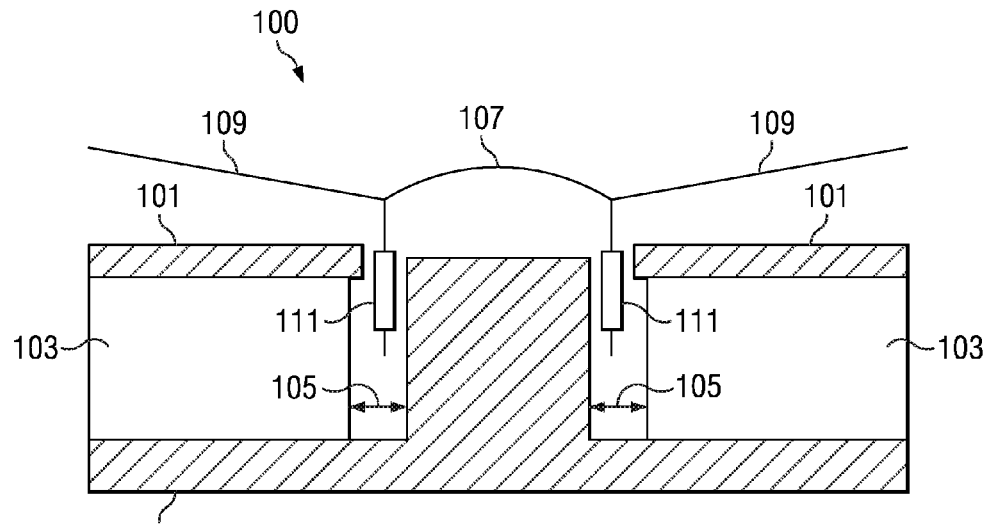
FIG. 1 is a cross-sectional view of an electro dynamic transducer (Prior Art).

FIG. 1 is a cross-sectional view of an electro dynamic transducer 100 (Prior Art). The electro dynamic transducer 100 may be used in a cellular phone, an electronic tablet, a laptop computer, a desktop computer, a television, a monitor, a portable radio, a portable musical playback system, a PDA and a media player. In this example of an electro dynamic transducer 100, the voice coil 111 is located in the magnetic field of the magnetic gap 105. The voice coil 111 is physically attached to the dome 107 of the electro dynamic transducer 100. A diaphragm 109 is attached to the dome 107 of the electro dynamic transducer 100. The magnet 103 and the magnetic circuit 101 provide a magnetic field for the voice coil 111. The suspension and frame of the electro dynamic transducer 100 are not shown is this example.

The voice coil 111 provides the motive to the diaphragm 109 by the reaction of the magnetic field provided by the magnet 103 and the magnetic circuit 101 to the current flowing through the voice coil 111. By driving a current through the voice coil 111, a magnetic field is produced. This magnetic field causes the voice coil 111 to react to the magnetic field from the permanent magnet 103 fixed to the speaker's frame (not shown), thereby moving the diaphragm 109 of the electro dynamic transducer 100. By applying an audio signal to the voice coil 111, the diaphragm 109 will reproduce the sound pressure waves corresponding to the original audio signal.

The amount of power that the electro dynamic transducer 100 may handle without damage is dependent, among other things, on the temperature of the magnet 103 and on the temperature of the voice coil 111.

Figure 2:
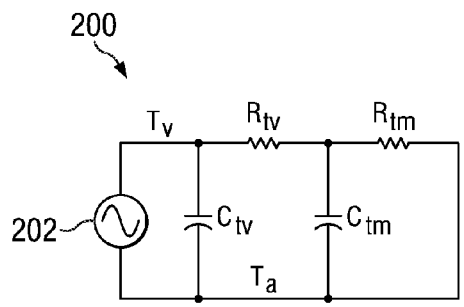
FIG. 2 is a schematic diagram of an embodiment of a thermal model used to determine the maximum power that may be delivered to a voice coil of an electro dynamic transducer without overheating the voice coil.

FIG. 2 is a schematic diagram 200 of an embodiment of a thermal model used to calculate the maximum power that may be delivered to a voice coil 111 of an electro dynamic transducer 100 without overheating the voice coil 111. In this schematic diagram 200, the thermal capacitance $C_{tv}$ of the voice coil 111 is connected to the temperature $T_v$ of the voice coil 111 and the ambient temperature $T_a$ of the environment that contains the electro dynamic transducer 100. The thermal capacitance $C_{tm}$ of the magnet is connected to the temperature $T_m$ of the magnet 103 and the ambient temperature $T_a$ of the environment that contains the electro dynamic transducer 100. The thermal resistance between the thermal capacitance $C_{tv}$ of the voice coil 111 and the thermal capacitance $C_{tm}$ of the magnet 103 is modeled by $R_{tv}$. The thermal resistance between thermal capacitance $C_{tm}$ of the magnet 103 and the ambient temperature $T_a$ is modeled by $R_{tm}$. The value of $R_{tv}$ and $R_{tm}$ may vary with the temperature $T_m$ of the magnet 103 and the temperature $T_v$ of the voice coil 111.

Power 202 in this example is applied directly to the thermal capacitor $C_{tv}$. When given a user-defined maximum voice coil temperature $T_{lim}$ and assuming steady state conditions, the maximum power $P_{lim}$ that may be delivered to the voice coil 111 without overheating is approximated by equation (1).

$$P_{lim}=(T_{lim}-T_m)/R_{tv} \quad (1)$$

In the case where the temperature $T_m$ of the magnet 103 is lower than the temperature $T_v$ of the coil 111, the thermal capacitance $C_{tm}$ of the magnet 103 acts as a heat sink for heat contained in the thermal capacitance $C_{tv}$ of the voice coil 111. Heat is conducted from the thermal capacitance $C_{tm}$ of the voice coil 111 through the thermal resistor $R_{tv}$ to the thermal capacitance $C_{tm}$ of the magnet 103. When the temperature of the magnet drops, the value of $P_{lim}$ increases.

The maximum power $P_{lim}$ that may be applied to the voice coil 111 changes with changes in the temperature of the magnet 103. In an embodiment of this invention, the amount of power applied to a voice coil 111 without overheating can be maximized by monitoring the temperature of the magnet 103.

Figure 3:
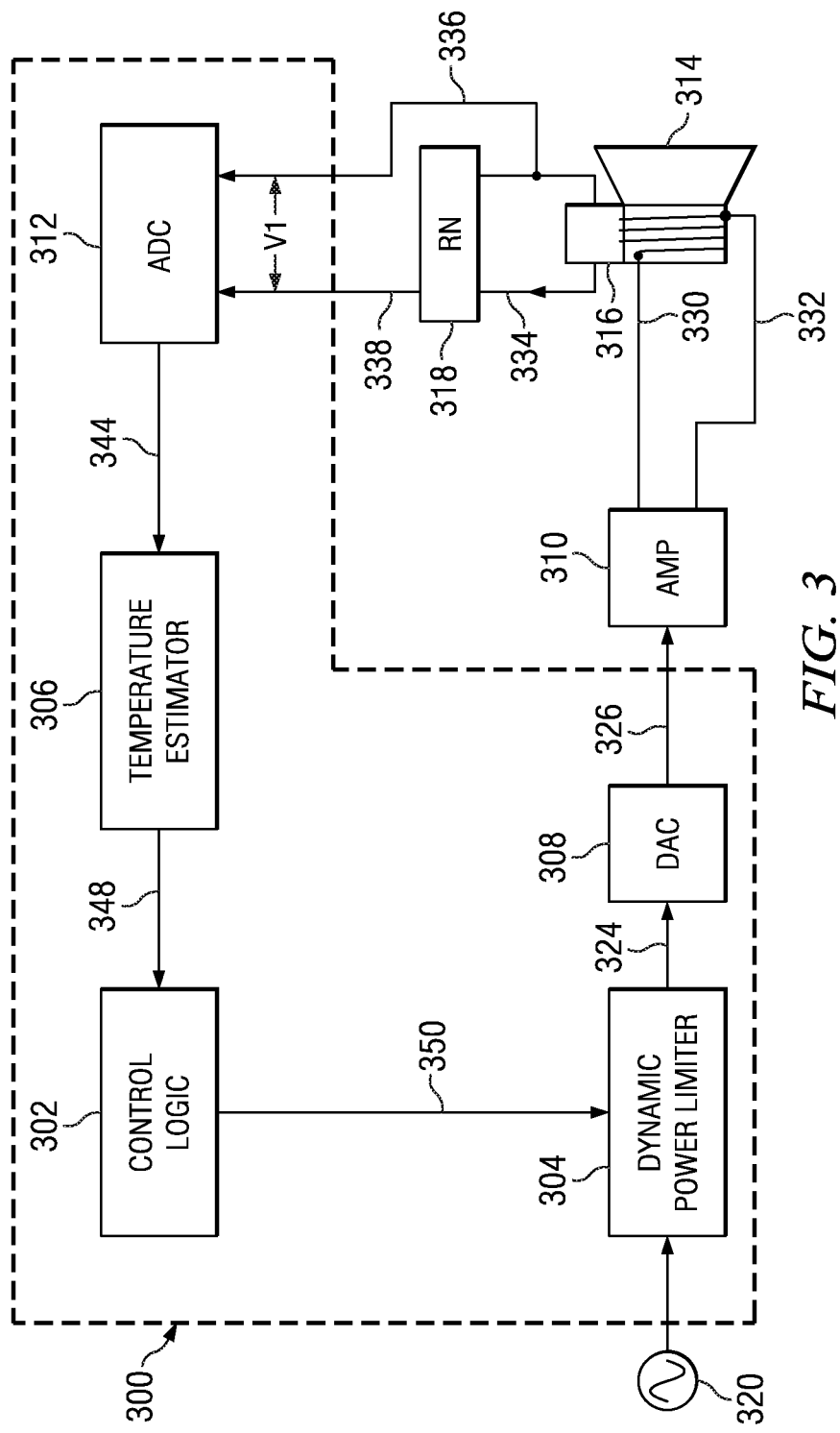
FIG. 3 is a block diagram of an embodiment of a thermal protection system used to protect the voice coil of an electro dynamic transducer from overheating.

FIG. 3 is a block diagram of an embodiment of a thermal protection system 300 used to protect a voice coil 111 from overheating. The protection system 300 comprises an ADC (analog to digital converter) 312, a temperature estimator 306, control logic 302, a dynamic power limiter 304 and a DAC (digital to analog converter) 308. The thermal protection system 300 along with the amplifier 310 and the resistive network 318 may be integrated on a single integrated circuit. In this example, the temperature estimator 306, the control logic 302 and the dynamic power limiter 304 are digital circuits. As consequence, the input audio signal 322 is a digital signal.

In an embodiment of the invention, a resistor 316 is affixed to the magnet 103 of the electro dynamic transducer 314. The resistor 316 in this example changes resistance as a function of the temperature of the magnet 103. The two nodes 334 and 336 of the resistor are connected to a resistive network 318. The resistive network 318 together with the resistor 316 may form a voltage divider (See FIG. 4) or a wheatstone bridge (See FIG. 5) for example.

Figure 5:
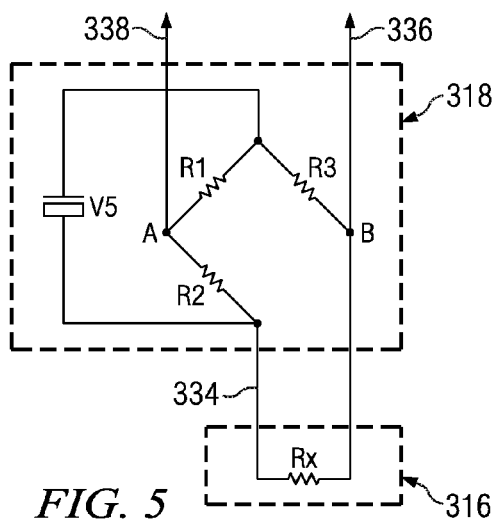
FIG. 5 is a schematic diagram of a wheatstone bridge that includes a resistor affixed to the magnet of an electro dynamic transducer.
Figure 4:
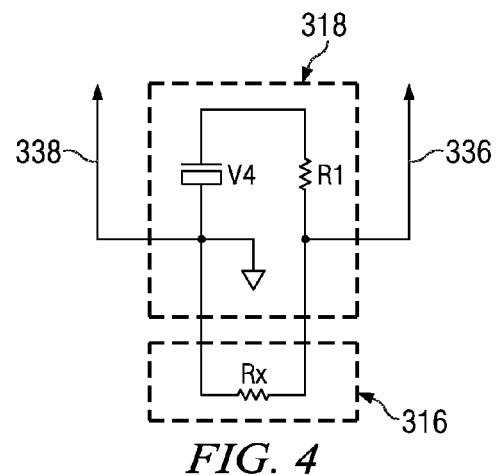
FIG. 4 is a schematic diagram of a voltage divider that includes a resistor affixed to the magnet of an electro dynamic transducer.

When the resistive network shown in FIG. 4 is used, a voltage divider is formed with resistor 316. The voltage divider then applies an analog voltage V1 to the ADC between nodes 336 and 338. The analog voltage V1 provided to the ADC is then converted to a digital representation 344. When the resistive network shown in FIG. 5 is used, a wheatstone bridge is formed with resistor 316. The voltage between nodes A and B of the resistive network 318 is provided to the ADC between nodes 338 and 336. The ADC converts a measurement of the voltage between nodes A and B into a digital voltage 344 that is applied to the temperature estimator 306. Based on the digital voltage 344, the temperature estimator 306 outputs an estimate 348 of the temperature of the magnet 103. The temperature estimate 348 may be calculated in several ways.

The temperature of the magnet 103 may be estimated by measuring the change in voltage V1 produced by the change in resistance of the resistor 316 as a function of temperature. The voltage V1 produced by the resistor 318 at different temperatures of the magnet 103 may be measured and cataloged. The results of these measurements may be included as part of a lookup table used in the temperature estimator 306. The temperature estimator 306 may also use an equation based on these measurements to give the temperature estimate 348 for the magnet 103.

The temperature estimate 348 is applied to the control logic 302. The control logic 302 in this example is deterministic. It uses equation (1) as previously discussed to dynamically control (through signal 350) the gain of the dynamic power limiter 304. The dynamic power limiter 304, for example, can reduce the power applied to the voice coil 111 to zero when $P_{lim}$ is equal to zero or is a negative number. When $P_{lim}$ is a positive number, the power applied to the voice coil 111 is dependent on the value of $P_{lim}$ and the power of the audio signal 322.

The audio signal 324 is then applied to the DAC 308. The DAC 308 converts the digital audio signal 324 to an analog signal 328. The analog signal 328 then drives the power amplifier 310. The power amplifier 310 then supplies current to the voice coil 111. When the power of the analog signal 326 is reduced, the output 330 of the power amplifier 310 supplies a smaller current to the voice coil 111 of the electro dynamic transducer 314 than would have been supplied if the audio signal 322 would not have been attenuated. Because a smaller current is supplied, the heating of the voice coil 111 is reduced.

In the previous example when the current supplied to the voice coil 111 was reduced to avoid overheating of the voice coil 111, the loudness of the electro dynamic transducer 314 would not be as loud as it would have been otherwise. However, because the current may only be limited for a short time, the perceived loudness of the electro dynamic transducer 314 does not change appreciably when compared to the case were the current is not reduced. The control logic 302 dynamically changes the amount of power applied to the voice coil based on the instantaneous temperature estimate 348.

In the previous example shown in FIG. 3, resistor 316 was coupled directly to the magnet 103. However, in other embodiments, the resistor 316 does not need to be directly coupled to the magnet 103. For example, the resistor 316 may be in close proximity to the magnet 103 such that heat from the magnet 103 changes the temperature of the resistor 316. In one embodiment, resistor 316 may be physically located on a PCB (printed circuit board) where the resistor 316 is near to the magnet 103.

Figure 6:
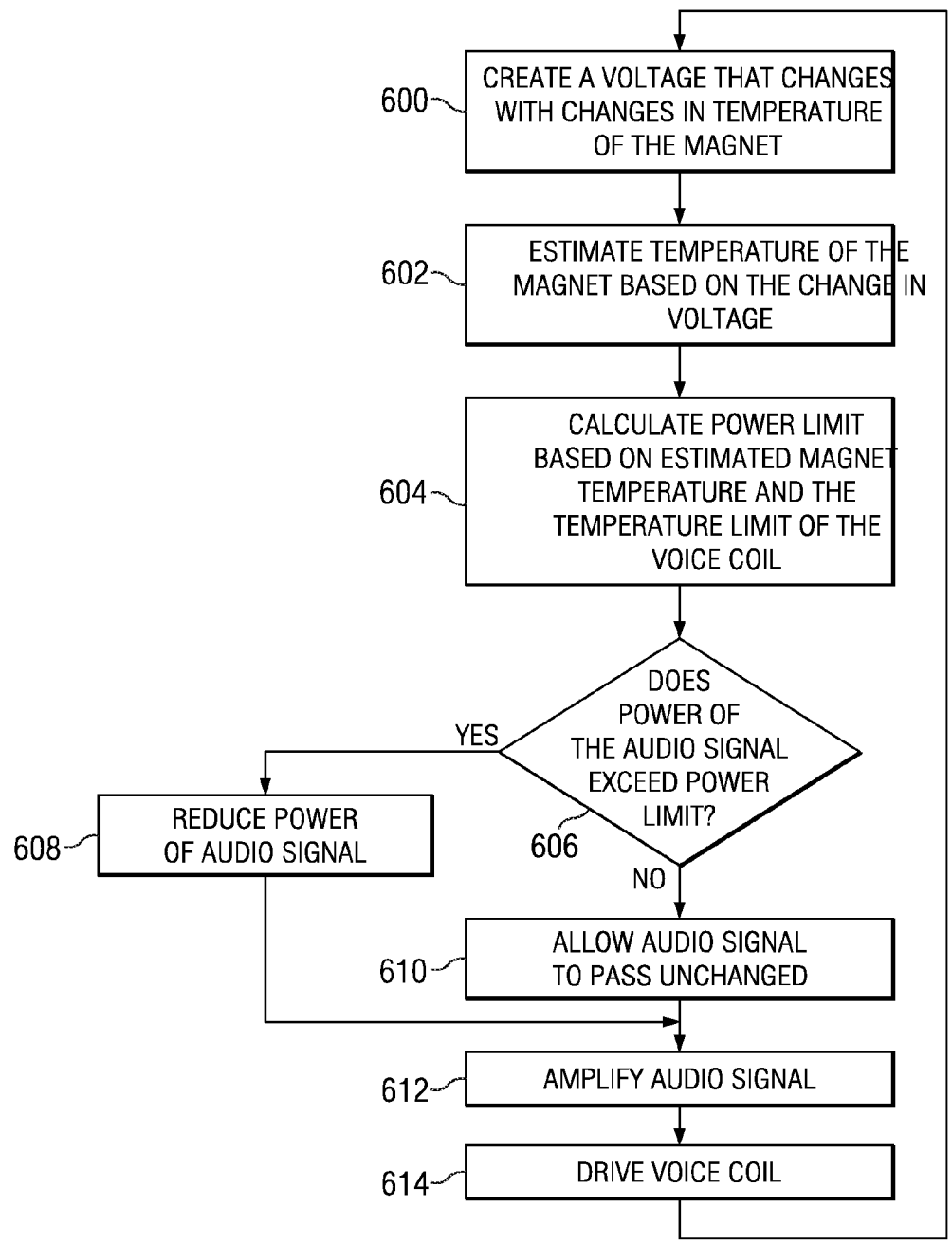
FIG. 6 is a flow diagram of an embodiment of a method of protecting the voice coil of an electro dynamic transducer from overheating.

FIG. 6 is a flow diagram of an embodiment of a method of protecting a voice coil in an electro dynamic transducer 314 from overheating. During step 600, the resistance of resistor 316 affixed to the magnet 103 of electro dynamic transducer 314 is used to create an analog voltage V1 as a function of the temperature of the magnet 103. After the analog voltage V1 is created, an estimate of the temperature of the magnet 103 is made during step 602. The estimate of the temperature of the magnet 103 can be made using a lookup table or an equation that are based on measured voltages or measured currents as a function of the temperature of the magnet.

During step 604, the temperature estimate for the magnet 103 and a temperature limit for the voice coil 111 are used to create a power limit. In a previous example, equation (1) was used to create the power limit. During step 606 the power of the audio signal is compared to the power limit. When the power of the audio signal is not greater than the power limit, the audio signal is not changed and is allowed to pass to the amplifier 310 as shown in step 610. When the power of the audio signal is greater than the power limit, the power of the audio signal is reduced as shown in step 608.

During step 612, the unchanged audio signal from step 610 or the attenuated audio signal from step 608 is amplified. During step 614 the amplifier 310 drives the voice coil 111. The process shown in FIG. 6 continues to monitor the temperature of the magnet 103 and the power of the audio signal 322 in order to prevent the voice coil 111 from overheating. The power limit and the temperature limit of the voice coil 111 may be set such that perceived loudness of the sound produced by the electro dynamic transducer 314 is nearly the same as when the input audio signal is not attenuated.

Figure 7:
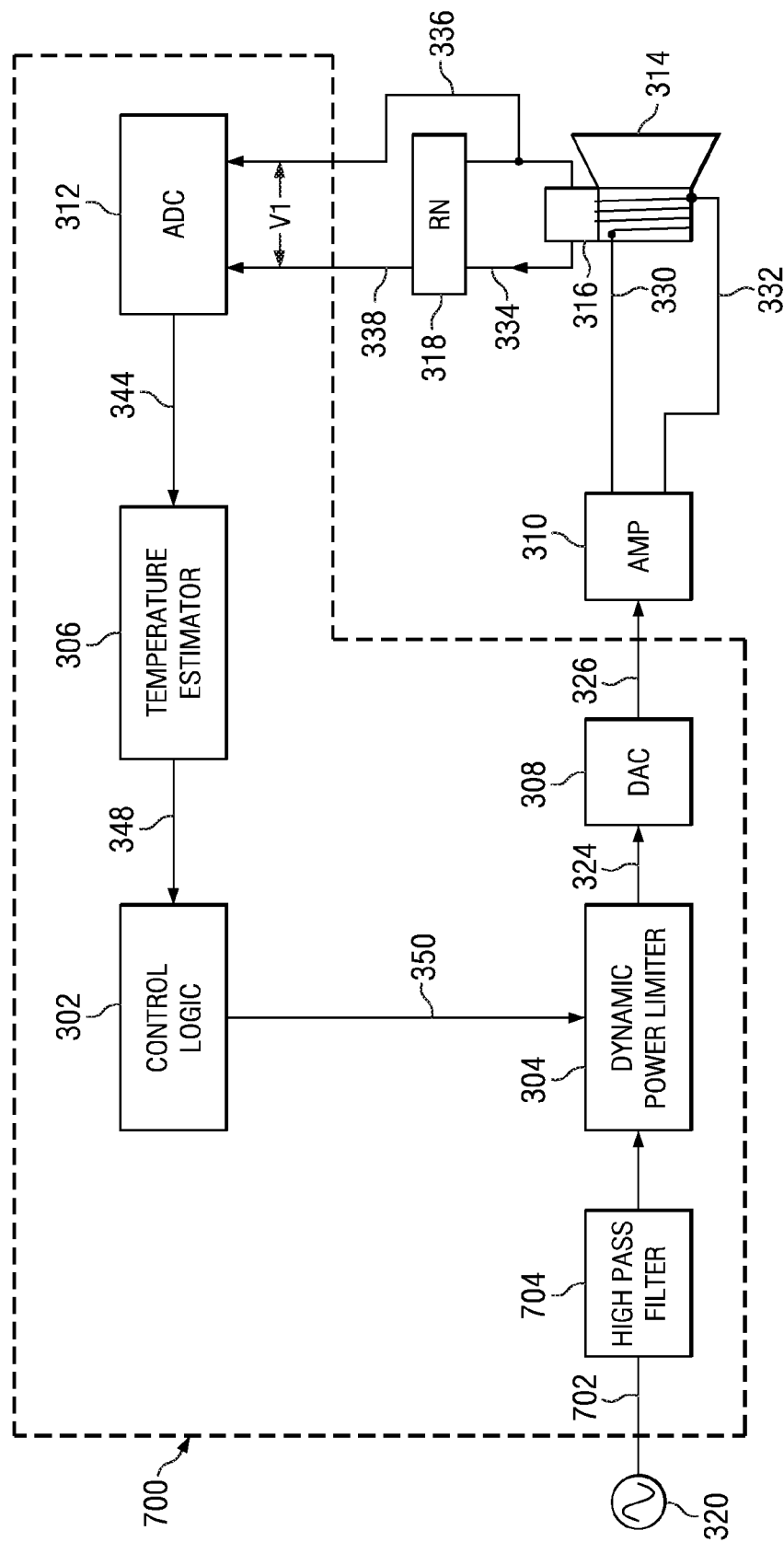
FIG. 7 is a block diagram of an embodiment of a thermal protection system used to protect a voice coil of an electro dynamic transducer from overheating.

FIG. 7 is a block diagram of an embodiment of a thermal protection system 700 used to protect an electro dynamic transducer 314. The protection system 700 comprises an ADC 312, a temperature estimator 306, control logic 302, a dynamic power limiter 304, high-pass filter 704 and a DAC 308. The protection system 700 shown in FIG. 7 is the same as the protection system 300 shown in FIG. 3 except for the addition of a high-pass filter 704 placed at the input of the protection system 700.

In the embodiment of the invention shown in FIG. 7, the high-pass filter 704 is added to remove low frequency signals that can not be reproduced by an electro dynamic transducer 314. For example, an electro dynamic transducer 314 located in a cell phone may not be able to reproduce frequencies below 200 Hz. Removing the frequencies below 200 Hz in the input audio signal 702, reduces distortion in the electro dynamic transducer 314. In addition, low frequency signals require more power to be reproduced than high frequency signals.

Because low frequency signals require more power to be reproduced, the current needed to drive the voice coil 111 is reduced when low frequency signals are removed from the input audio signal 702. Reducing the amount of current needed to drive the voice coil 111 also reduces the heating of the magnet 103 and the voice coil 111. Therefore, removing low frequency signals from the audio signal helps protect the electro dynamic transducer 314 from overheating of the voice coil 111.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method for protecting a voice coil in an electro dynamic transducer against a thermal overload, comprising:
   estimating a temperature of a magnet in the electro dynamic transducer;
   reducing a power applied to the voice coil when a power of an audio signal exceeds a power limit $P_{lim}$;
   wherein the power limit $P_{lim}$ is approximately determined by the temperature of the magnet and a predetermined voice coil temperature limit;
   wherein the power limit $P_{lim}$ is proportional to:

$(T_{lim} - T_m)/R_{tv}$ wherein $T_{lim}$ is the predetermined voice coil temperature limit;
   wherein $T_m$ is the temperature of the magnet;
   wherein $R_{tv}$ is the thermal resistance of a path from the voice coil to the magnet; and
   wherein when the power limit $P_{lim}$ is equal to or less than zero, no power is applied to the voice coil;
   wherein when the power limit $P_{lim}$ is a positive number, the power applied to the voice coil is dependent on a value of $P_{lim}$ and the power of the audio signal.

2. The method of claim 1 wherein a value of $R_{tv}$ varies with the temperature $T_m$ of the magnet and the temperature of the voice coil.

3. An apparatus for controlling a temperature of a voice coil in an electro dynamic transducer comprising:
   an amplifier, the amplifier having an input and an output wherein the voice coil is electrically connected to the output of the amplifier;
   a DAC having an output and an input wherein the output of the DAC is electrically connected to the input of the amplifier;
   a dynamic power limiter, the dynamic power limiter having two inputs and an output, the output of the dynamic power limiter electrically connected to the input of the DAC;
   a first resistor having first and second nodes; wherein the resistance of the first resistor changes resistance with changes in temperature of a magnet contained in the electro dynamic transducer;
   a resistive network having two inputs and two outputs wherein the two inputs are electrically connected to the first and second nodes of the first resistor;
   an ADC having inputs and outputs wherein a first analog voltage is presented at the inputs of the ADC; wherein the first analog voltage is a voltage across the two outputs of the resistive network; wherein a first output from the ADC is a digital representation of the first analog voltage;
   a temperature estimator, the temperature estimator having an input and an output, wherein the digital representation of the first analog voltage is presented at the input of the temperature estimator;
   a control logic circuit, the control logic circuit having an input and an output wherein the input of the control logic circuit is electrically connected to the output of the temperature estimator and the output of the control logic circuit is electrically connected to a first input of the dynamic power limiter;
   wherein a digital audio signal is directed to a second input of the dynamic power limiter;
   wherein power applied to the voice coil is controlled by a power limit $P_{lim}$ and a power of the digital audio signal;
   wherein the power limit $P_{lim}$ is proportional to:

$(T_{lim} - T_m)/R_{tv}$ wherein $T_{lim}$ is the predetermined voice coil temperature limit;
   wherein $T_m$ is the temperature of the magnet;
   wherein $R_{tv}$ is the thermal resistance of a path from the voice coil to the magnet; and
   wherein when the power limit $P_{lim}$ is equal to or less than zero, no power is applied to the voice coil.

4. The apparatus of claim 3 wherein the value of $R_{tv}$ varies with the temperature $T_m$ of the magnet and the temperature of the voice coil.

* * * * *